(12) United States Patent
Tercariol et al.

(10) Patent No.: US 11,190,171 B2
(45) Date of Patent: Nov. 30, 2021

(54) SCHMITT TRIGGER VOLTAGE COMPARATOR

(71) Applicant: NEXPERIA B.V., Nijmegen (NL)

(72) Inventors: Walter Luis Tercariol, Nijmegen (NL); Maikel Pieter Sturkenboom, Nijmegen (NL); Geethanadh Asam, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 17/095,192

(22) Filed: Nov. 11, 2020

(65) Prior Publication Data

US 2021/0159890 A1 May 27, 2021

(30) Foreign Application Priority Data

Nov. 22, 2019 (EP) .................................. 19210891

(51) Int. Cl.
*H03K 3/02* (2006.01)
*H03K 3/037* (2006.01)

(52) U.S. Cl.
CPC ................. *H03K 3/0377* (2013.01)

(58) Field of Classification Search
CPC .................................................. H03K 3/0377
USPC ......................................................... 327/198
See application file for complete search history.

(56) References Cited

U.S. PATENT DOCUMENTS

| | | | |
|---|---|---|---|
| 4,786,825 A | 11/1988 | O'Shaughnessy et al. | |
| 5,796,281 A | 8/1998 | Saeki et al. | |
| 5,990,753 A | 11/1999 | Danstrom et al. | |
| 6,275,082 B1 * | 8/2001 | Kiehl | H03K 3/3565 327/108 |
| 9,007,137 B2 * | 4/2015 | Inoue | H03K 3/0231 331/111 |
| 9,287,823 B1 * | 3/2016 | Holzmann | H03K 3/0231 |
| 2008/0054866 A1 * | 3/2008 | Korsunsky | H02M 1/08 323/272 |

(Continued)

FOREIGN PATENT DOCUMENTS

WO 9323925 A1 11/1993

OTHER PUBLICATIONS

Extended European Search Report for priority European application No. EP19210891.8, 13 pages, dated May 26, 2020.

*Primary Examiner* — Ryan Jager
(74) *Attorney, Agent, or Firm* — Ohlandt, Greeley, Ruggiero & Perle, LLP

(57) ABSTRACT

A Schmitt trigger voltage comparator circuit is provided including a voltage reference input, a current source having a first voltage controlled current source connected to the voltage reference input and a second voltage controlled current source connected to a signal input for converting the signal input to a input current and the voltage reference input to a reference current, a current mirror having an input connected to the output of the first voltage controlled current source configured and arranged to invert the direction of the first current and an output of the current mirror connected to the output of the second voltage controlled current source, and a sequence controller for generating digital signals to control a first plurality of switches and a second plurality of switches. The first plurality of switches control the first and second voltage controlled current sources and the second plurality of switches control the current mirror.

20 Claims, 5 Drawing Sheets

(56) References Cited

U.S. PATENT DOCUMENTS

2019/0386615 A1* 12/2019 Kim ...................... H03K 5/135

* cited by examiner

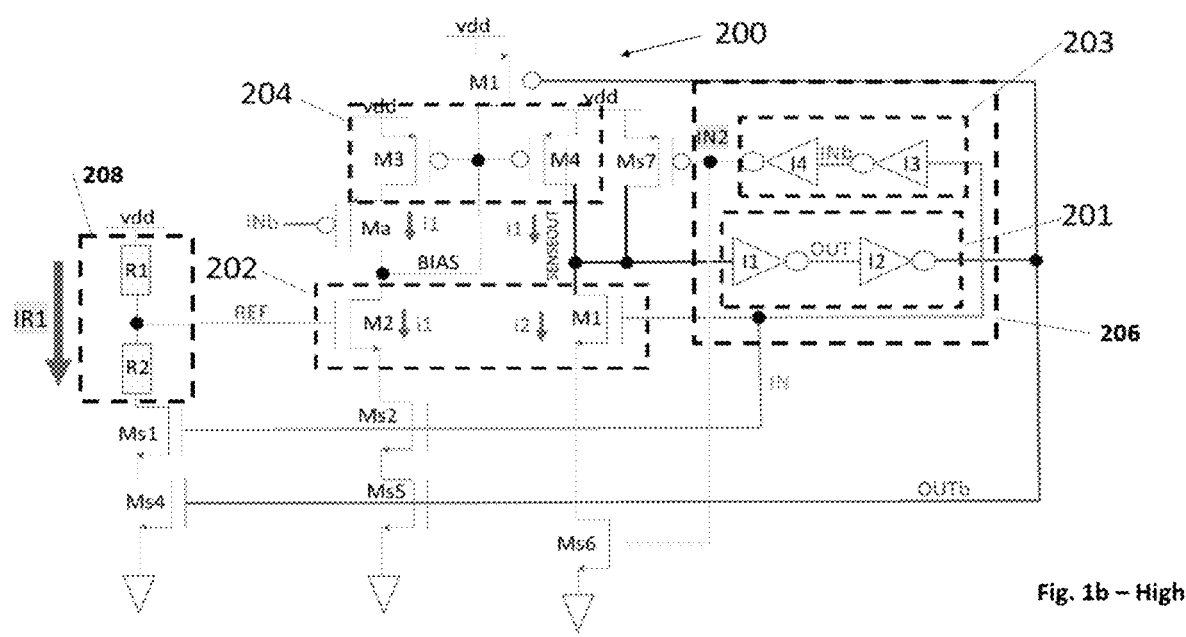
Fig. 1b – High

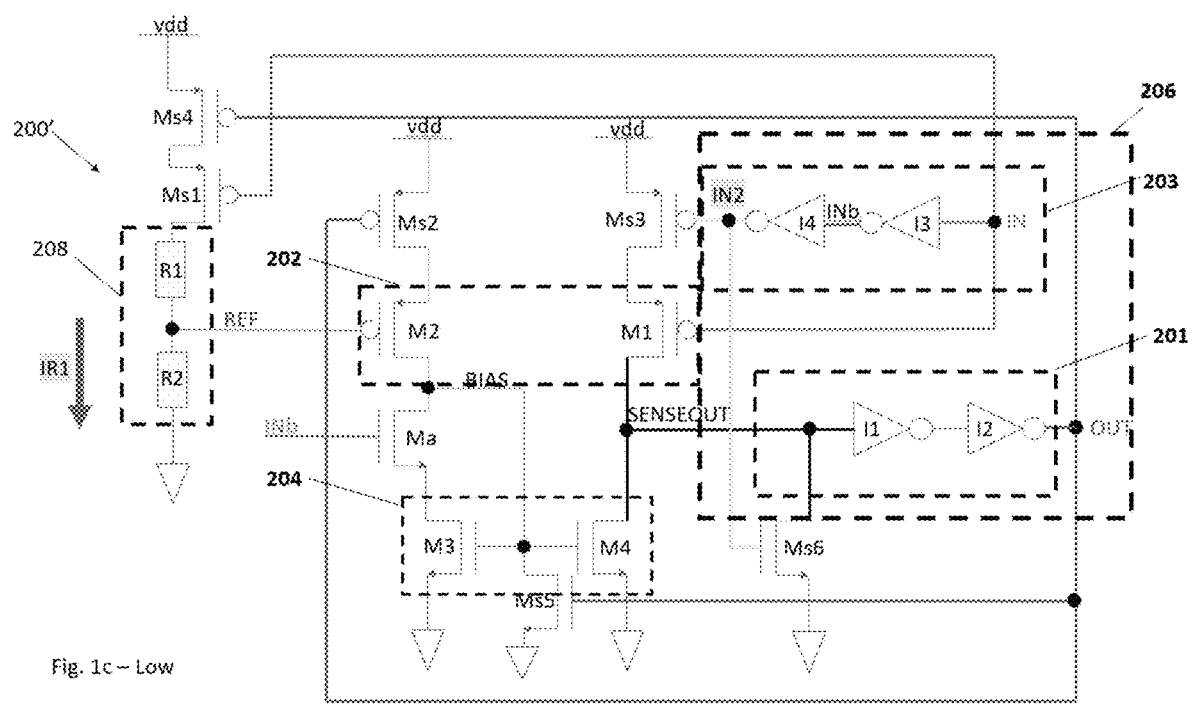
Fig. 1c – Low

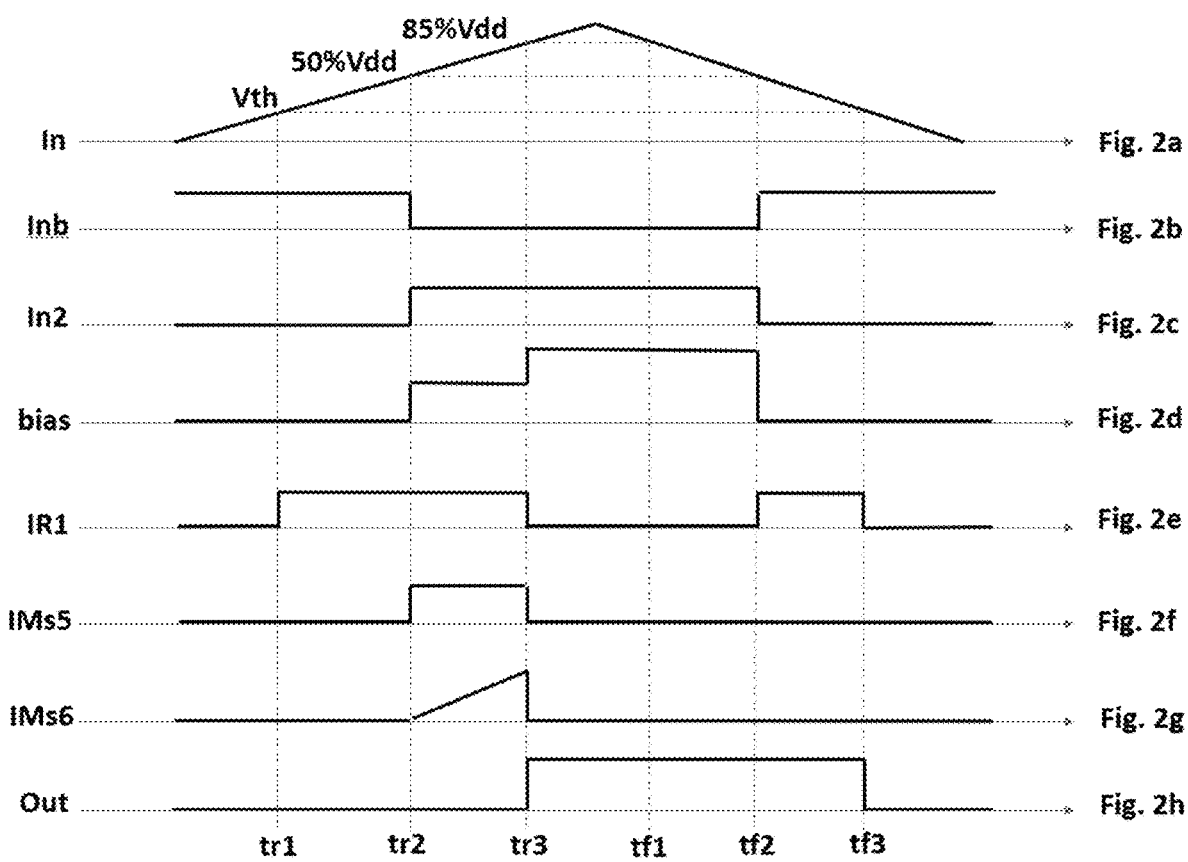

SCHMITT TRIGGER VOLTAGE COMPARATOR

CROSS REFERENCE TO RELATED APPLICATION

This application claims the benefit under 35 U.S.C. § 119(a) of European Application No. 19210891.8 filed Nov. 22, 2019 the contents of which are incorporated by reference herein in their entirety.

BACKGROUND OF THE DISCLOSURE

1. Field of the Disclosure

The present disclosure relates to a voltage comparator. In particular, the disclosure relates to a Schmitt trigger voltage comparator and more particularly an integrated circuit comprising such Schmitt trigger voltage comparator.

2. Description of the Related Art

A Schmitt trigger is a common electronic circuit that is use in various applications such as analog to digital conversion and level detection in the field of integrated circuits. Schmitt triggers are electronic circuits with positive feedback. Taking an inverting Schmitt trigger as an example, when the input voltage of an inverting Schmitt trigger rises, the output level is kept high until the input signal crosses the high threshold voltage VT+ (also referred to as Vih). When the input voltage of an inverting Schmitt trigger is falling, the output level is kept low until the input signal crosses the low threshold voltage VT− (also referred to as Vil). The difference between the threshold voltages VT+ (or Vih) and VT− (or ViL) is called the hysteresis voltage. Generally, known Schmitt trigger circuits comprise an inverter functionality and threshold setting functionality to set the respective threshold voltages VT− and VT+. However, known Schmitt triggers suffer from the problem that they do not have a reference input which can make setting of the respective threshold voltages VT− and VT+ difficult. The threshold voltages are determined by dimensions and (process variations used to fabricate the components) making up the Schmitt trigger architecture, and these variations can lead to undefined and unwanted variations in the threshold voltages because the threshold voltages vary strongly over process, voltage, temperature (PVT). Furthermore, known Schmitt triggers suffer from the problem that ratio of threshold voltage VT+ and VT− to supply voltage may be unstable when the supply voltage varies. The hysteresis generated by such Schmitt trigger is not very precise because the threshold voltages VT+ and VT− are fully dependent on supply voltage VDD and transistor threshold voltage Vth and may result in a PVT variation, particularly when the threshold voltages are extended, that is the VT+ is increased from 50% of VDD, to for example 80% of VDD. Likewise, the same disadvantage can occur when VT− is reduced from 50% of VDD to for example 20% of VDD.

Several topologies comprising Schmitt triggers function exist make use of one or more voltage comparators. An advantage of using voltage comparators is that threshold voltages can be set independently of the process, voltage, temperature (PVT) issues described above. For example, a very accurate external reference can be connected such as a voltage divider may be used.

However, a disadvantage of topologies using voltage comparators is that they consume DC current. Generally, any analog circuits spend consume current (from few nA to mA) and more current means more precision and more accuracy, and likewise less current less precision and less accuracy. The challenge is how to develop analog circuits with high precision and high accuracy with zero current consumption.

Furthermore, a disadvantage of the resistive divider, setting threshold voltage relative to supply, is also continuous DC current consumption.

SUMMARY

Various example embodiments are directed to issues such as those addressed above and/or others which may become apparent from the following disclosure concerning a voltage comparator which is capable of operating over wide range of supply voltages VDD, with no DC current consumption when the input voltage is at maximum or zero VDD. This results in a voltage comparator which is capable of ultra-low power operation and high precision operation. In addition, certain example embodiments, aspects of the present disclosure also concern a variable threshold voltage VT+, VT− voltage comparator. In the context of the present disclosure, no DC current consumption means zero static current, that is 0 Amps.

According to an embodiment there is provided a Schmitt trigger voltage comparator circuit, comprising: voltage reference input; a current source having a first voltage controlled current source connected to the voltage reference input and a second voltage controlled current source connected to a signal input for converting the signal input to a input current and the voltage reference input to a reference current; a current mirror having an input connected to the output of the first voltage controlled current source configured and arranged to invert the direction of the first current and an output of the current mirror connected to the output of the second voltage controlled current source; and a sequence controller for generating digital signals to control a first plurality of switches and a second plurality of switches, wherein the first plurality of switches control the first and second voltage controlled current sources and the second plurality of switches control the current mirror.

The sequence controller may comprise: a first buffer and a second buffer; the first buffer configured and arranged to control the current mirror and first voltage controlled current source, and the second buffer configured and arranged to control the current mirror and the second voltage controlled current source.

The first buffer is connected to a first current mirror enable switch and a first voltage controlled current source enable switch, and the second buffer connected to a second current mirror enable switch and a second voltage controlled current source enable switch.

The first buffer may comprise two inverters and the second buffer may comprise two inverters.

The Schmitt trigger voltage comparator may further comprise a reference voltage circuit connected the voltage reference input.

The voltage reference circuit may be a resistive voltage divider, comprising first and second control switches and wherein the first control switch controls the voltage reference based on the input signal and the second control switch controls the voltage reference based on a signal from the sequence controller.

The Schmitt trigger voltage comparator circuit may be configured and arranged such that when the input signal is at a zero level or maximum level there is zero DC current consumption at maximum or minimum supply voltage.

According to an embodiment there is also provided a logic circuit comprising: a first Schmitt trigger voltage comparator circuit and a Schmitt trigger voltage comparator circuit according to claims, wherein the first voltage comparator is a high to low voltage comparator and the second voltage comparator is a low to high voltage comparator.

The level of the voltage reference is in the range 5-95% of a supply voltage. The level of the voltage reference for the high to low voltage comparator 50-95% is of the supply voltage. The level of the voltage reference for the low to high voltage comparator 5-50% is of the supply voltage.

The first Schmitt trigger voltage comparator circuit is configured and arranged to detect a low voltage to a high voltage transition in the range of and the second Schmitt trigger voltage comparator circuit is configured and arranged to detect a high voltage to low voltage transition.

The logic circuit may further comprise a latch, for receiving an output of the first Schmitt trigger voltage comparator circuit and the second Schmitt trigger voltage comparator circuit, the latch comprising an output, wherein the output is enabled when the out of the first Schmitt trigger voltage comparator circuit is high and the output of the second Schmitt trigger voltage comparator circuit is low. The latch may be a Set-Reset Latch.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

FIG. 1b illustrates a circuit diagram of a high to low Schmitt trigger circuit according to the block diagram of FIG. 1a.

FIG. 1c illustrates a illustrates a circuit diagram of a low to high Schmitt trigger circuit according to the block diagram of FIG. 1a.

FIGS. 2a to 2h illustrate the operational waveforms for the high to low Schmitt trigger circuit of FIG. 1b.

FIG. 3b illustrates operational waveforms for the voltage comparator circuit of FIG. 3a.

DETAILED DESCRIPTION

In the following description like references correspond to like features. In particular, voltage nodes having common designations will be understood to be at the same potential.

Figure 1A:
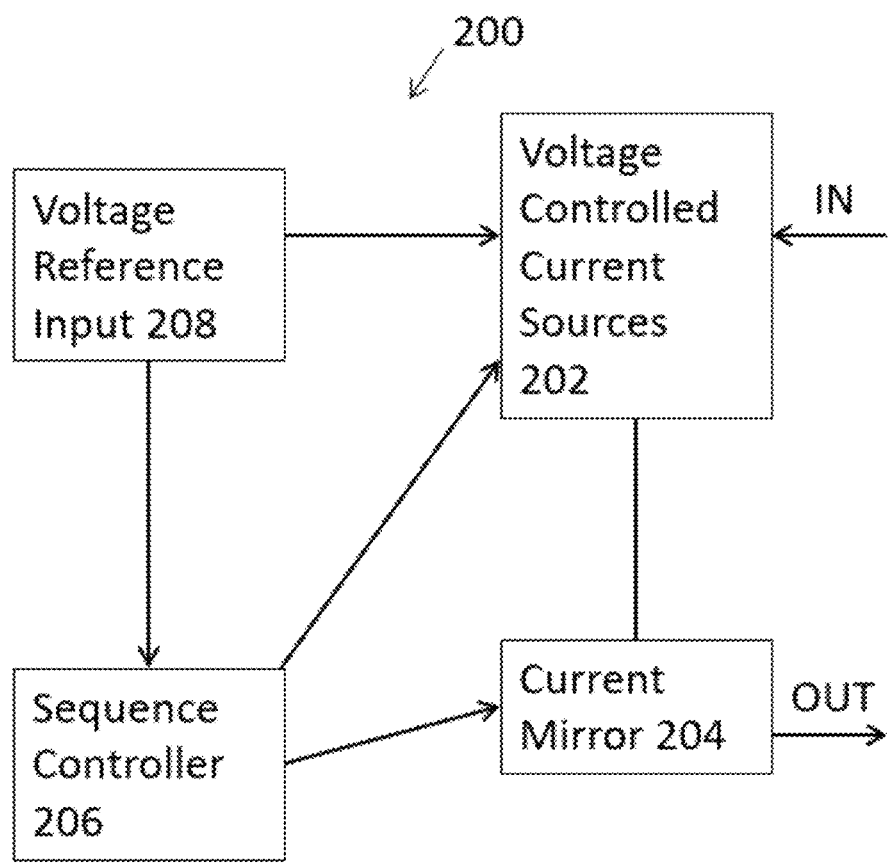
FIG. 1a illustrates a functional block diagram of a Schmitt trigger circuit according to an embodiment.

FIG. 1a illustrates a functional block diagram of a Schmitt trigger voltage comparator circuit 200 according to an embodiment of the present disclosure. The Schmitt trigger circuit 200 comprises a voltage controlled current source 202, a current mirror 204, a sequence controller 206 and a voltage reference input 208.

The current source 202 comprises the input IN of the Schmitt trigger voltage comparator circuit 200. The current mirror 204 comprises the output OUT of the Schmitt trigger voltage comparator circuit 200 and is also connected to the current source 202.

The current source 202 is connected to one of the plurality of voltage reference inputs 208, the sequence controller 206 and the current mirror 204. The sequence controller is connected to another of the plurality of voltage reference inputs 208.

The voltage reference input 208 is used to set Vih (that is the minimum voltage above which an input is considered as high) or Vil (that is the is the maximum voltage below which input is considered as low) at a certain fraction of a supply voltage VDD. In the case where Vih, the voltage reference input 208 functions to set Vih by biasing the voltage controlled current source 202 as discussed in more detail below with respect to FIG. 1b. In the case of Vil, the voltage reference input 208 functions to set Vil by biasing the voltage controlled current source 202 as discussed in more detail below with respect to FIG. 1c. In the present example Vih is set at 85% of the supply voltage VDD, however, the skilled person will recognise that Vih can be any appropriate fraction of VDD between 51% and 91% or in the case of Vil any appropriate fraction of VDD between 10% and 50%. In this way the arrangement of FIG. 1a can be configured and arranged as a low to high Schmitt trigger or a high to low Schmitt trigger, as discussed in more detail below.

The Current Mirror 204 is connected to the voltage controlled current sources 202. The voltage controlled current sources 202 are responsible for converting the input voltage signal IN, (where in this example the reference voltage input 208 is 85% of VDD and the input voltage signal IN voltage is variable voltage input) into a current mode. Specifically, the voltage controlled current sources 202 converts the reference voltage input 208 into a reference current, and the reference current is them mirrored by the current mirror. The voltage controlled current sources 202 also converts the input voltage signal IN into a current which flows the current mirror 204.

The sequence controller 206 is connected to the voltage controlled current sources 202 and Current Mirror 204 to ensure that each operates at the correct time to ensure glitch free operation of the Schmitt trigger circuit 200. In addition, the sequence controller 206 also controls the mode of the Schmitt trigger circuit 200 to switch between comparison modes being on or off and to control the output state between on or off.

The Schmitt trigger circuit 200 of FIG. 1b implements the functional block diagram of FIG. 1a. The Schmitt trigger circuit of FIG. 1b is a low to high triggered circuit. The current mirror 204 is formed of first and second current mirror transistors M3, M4 and the voltage controlled current sources 202 are formed of first and second current source transistors M1, M2. The comparison function is implemented using transistors M1 to M4, where M1 and M2 convert the reference and input voltages to currents and using the mirror formed by M3 and M4 the currents are compared at node SENSEOUT. The current sources 202 are biased by the voltage reference input 208, in this example comprising respective voltage divider resistances R1, R2, however the skilled person will understand that any suitable voltage reference may be used. In the present example the voltage divider resistances R1 and R2 are connected in series where such that the reference voltage REF is selected to be 85% of VDD. However, the skilled person will appreciate that the reference voltage can be any value from 0V to VDD based on the following expression:

(voltage reference) REF=(R2/(R1+R2))VDD

The sequence controller 206 comprises a first buffer 201 having a pair of inverters I1, I2. The first inverter I1 is connected to a SENSEOUT node which is responsible for driving the SENSEOUT node to output node OUT at the input of the second inverter I2. The output node OUT node is connected to the voltage controlled current sources 202 through a transistor M1 which is responsible for converting the voltage input IN into a current signal i2 and transistor M4 current mirror 204. A current signal i1, which is the reference current translated from M3 and mirrored by a transistor M4 of current mirror 204 is lower than current signal i2, the SENSEOUT voltage node is pulled down to GND voltage by a current source transistor M1 of the voltage controlled current sources 202. Similarly, when the current signal i2 is greater than current signal i1 the SENSEOUT voltage node is pulled up to VDD by a current mirror transistor M4. The OUT voltage is driven by the first inverter and the second inverter I2 output node OUTb is pulled up to VDD keeping transistors Ms4 and Ms5 in strong inversion and current source transistor M1 into cut-off region when current signal i1 is greater than i2. In other words, the input signal IN voltage applied to current source transistor M1 of the voltage controlled current sources is lower than the reference voltage REF applied on current source transistor M2.

However, if the second inverter I2 output node OUTb is pulled down to GND voltage transistors Ms4 and Ms5 are then held in cut-off region and current source transistor M1 operates in strong inversion when current signal i1 is lower than current signal i2. In other words, the input signal voltage IN applied to current source transistor M1 transistor is higher than the reference voltage REF applied on current source transistor M2.

The function of second buffer 203 is to delay IN2 voltage transition in order to keep voltage OUT node tied to VDD as long as possible because Ms7 releases that node when input signal voltage IN crosses the threshold voltage Vth of Ms2. This strategy is used to avoid possible glitch on voltage OUT node as discussed in more detail below.

The OUTb node is at VDD during ramp up due to the OUT node voltage state and will be responsible for turning off the current consumption when OUT voltage is pulled down by transistor M1 when the input voltage signal IN is greater than 85% of VDD.

The transistor Ms6 is kept in cut-off region and transistor Ms7 is biased in strong inversion by the second inverter I2 output voltage when input signal voltage IN is lower than a second buffer 203 comprising first inverter I3 and second inverter I4. Transistor Ms7 is biased to operate strong inversion and transistor Ms6 is biased to operate in cut-off because OUT voltage node driven by first inverter I1 must be tied to GND when input voltage signal IN is lower than REF voltage.

The sequence controller 206 is thus responsible for precharging and avoid glitches on SENSEOUT node. That is, the current signal i1 must be ready and the current signal i1 must be greater than current signal i2 in order to avoid that SENSEOUT node is pulled down to GND by any intrinsic capacitance, which may occur in the current source transistor M1, which may result in correct voltage comparisons.

FIG. 1c shows a Schmitt trigger circuit 200' which also implements the functional block diagram of FIG. 1a. The Schmitt trigger circuit 200' of FIG. 1c is a high to low triggered circuit where like reference numerals correspond to like features of FIG. 1b and comprises a voltage controlled current source 202, a current mirror 204, a sequence controller 206 and a voltage reference input 208 consistent with the above described embodiment.

For example, the voltage controlled current sources 202 of the high to low Schmitt trigger circuit 200' may be implemented using NMOS transistors M1, M2 whereas for the low to high Schmitt trigger circuit 200 topology the voltage controlled current sources may be implemented using PMOS transistors M1, M2. Similarly, the same criteria is for the remaining transistors, that is NMOS transistors will be replaced with PMOS transistors and PMOS transistors will be replaced by NMOS transistors.

The functionality of the Schmitt trigger circuit 200 of FIG. 1b can be better understood with reference to the waveforms of FIGS. 2a to 2h, which illustrates operational waveforms, showing voltage versus time t, at various nodes of the Schmitt trigger circuit 200.

The waveform IN of FIG. 2a is the input signal voltage expressed as a percentage of VDD at the input node IN of the first Schmitt trigger circuits 200. The input voltage waveform IN is shown as a triangle wave for simplicity of explanation only. The skilled person will however appreciate that any sinusoidal or non-sinusoidal input voltage waveform may be used. The waveform IN waveform represents the input signal at the input node IN of FIG. 1b, during rising and falling event. The waveform IN is divided into six events tr1 to tr3 and tf1 to tf3 over the time t. Events tr1 to tr3 represent ramp up and events tf1 to tf3 represent ramp down. The first event tr1 which depicts the waveform IN signal rising from 0V to the threshold voltage Vth of the switching transistor Ms1. The second event tr2 represents 50% of supply voltage (VDD) and the third event tr3 represents 85% of supply voltage (VDD). The fourth event tf1 represents 85% of VDD as the waveform IN is falling. The fifth event tf2 represents 50% of VDD as the waveform IN is falling and the sixth point event tf3 is the threshold voltage Vth as the waveform IN is falling.

As the input signal voltage rises to reach Vth at time tr1, where Vth is the threshold voltage of switching transistor Ms2 which controls the turn-on or off of the voltage controlled current source transistor M2 and also the threshold voltage of the switching transistor Ms1 which controls the turn-on or off of the voltage reference.

FIG. 2b illustrates a waveform which represents the behaviour of the node INb of FIG. 1b during ramp up and ramp down events of waveform IN. The signal at node INb represents the voltage behaviour of at output of inverter I3 of the buffer 203 illustrated in FIG. 1b. During ramp up of waveform IN, INb is tied to VDD from 0V to 50% of VDD as at event tr2 because the inverter I3 has not yet been swept as a logic function. The signal at node INb will be tied to 0V (GND) up to event tf2 because the voltage at waveform IN is higher than 50% of VDD. When waveform IN voltage is between tf2 point and 0V during a falling event the voltage at node INb will be tied to VDD because the voltage at waveform IN is lower than 50% of VDD following the inverter logic gate behaviour.

The INb control signal is keeps PMOS transistor Ma of FIG. 1b, tuned off (where INb is tied to VDD) up to event tr2. This strategy is used in order to guarantee that the voltage at node BIAS of FIG. 1b is forced to be 0V before transistor Ms7 is turned off and transistor Ms6 is turned on.

The transistor Ms4 will therefore have the maximum gate source voltage (VGS) possible that is VGS=−VDD and consequently current mirror transistor M4 will conduct to the maximum possible extent.

The waveform of FIG. 2c represents which represents the behaviour of the control signal IN2 of FIG. 1b during ramp up and ramp down events and the skilled person will see that this is the inverted form of the behaviour of node INb.

The control signal IN2 controls the turn on of transistor Ms6 and turn off of transistor Ms7 when voltage of waveform IN is greater than 50% of VDD. Likewise, transistor Ms6 is turned off and transistor Ms7 is turned on voltage of waveform IN is below 50% of VDD. However, control signal IN2 represents the comparison stage initialization when the when BIAS voltage is settled to be a diode voltage that is when the drain voltage is equal to the gate voltage when transistor Ms6 is turned on and transistor Ms7 is turned off.

The waveform of FIG. 2d represents the BIAS voltage behaviour during ramp up and ramp down events. From 0V to event tr2 during ramp up the BIAS voltage is tied to GND. From event tr2 to event tr3 the BIAS voltage level will be determined by the current which is passing through current mirror transistor M3 which is connected as a diode mode transistor. The current mirror transistor M3 is biased in a saturation region and the BIAS voltage follows the square root law between the gate source voltage (VGS) and the drain source current (Id). The BIAS level voltage will be between 0V and VDD and copies or mirrors the reference current i1 translated by transistor M2 to transistor M4. The BIAS level will be fixed between tr2 and tr3 when the voltage of waveform IN is higher than REF voltage and consequently the current i2 will be higher than fixed current i1. The BIAS voltage will then be tied to VDD at this moment because transistor M1 is turned on by the signal OUTb. The BIAS voltage will switch to GND through transistor Ms5 in series with transistor Ms2 when voltage of waveform IN crosses 85% of VV=DD at event tf2 during falling event.

There are two voltages which BIAS voltage node must be biased. The first BIAS voltage is biased is GND voltage. This voltage is set during ramp up when IN voltage is between 0V (GND) and around 50% VDD when IN2 voltage driven by inverters I3 and I4 are at 0V (GND) and transistor Ma is operating in the cut-off region. The second possible BIAS voltage is when input voltage IN is between 50% VDD to 85% VDD determined by the current i1 when transistor M3 is connected in DIODE mode.

The waveform of FIG. 2e represents the behaviour of current IR1 during ramp up and ramp down events. The current IR1 is the current which flows through the reference 208 which is composed by a ladder of resistance R1, R2 and two switch transistors Ms1 and Ms4.

The current IR1 is 0 A when input voltage IN is between 0V and Vth at event tr1 and transistor Ms1 is turned off. When the input voltage IN is higher than the threshold voltage Vth and transistor Ms1 is turned on, the current IR1 current starts flow and will be constant until 85% of VDD at event tr3.

The current IR1 will be 0 A between 85% of VDD between events tr3 and tf2 when transistor Ms4 is turned off. The current IR1 will be turned on again between events tf2 and tf3 when transistor Ms4 is turned on by the voltage at node OUTb and will be tuned off after event tf3 point when transistor Ms1 transistor is turned off.

The waveform of FIG. 2f represents the current behaviour IMs5 during ramp up and ramp down events. The current behaviour IMs5 is the current through switch transistor Ms5 that is non-zero when switch transistor Ma is turned on. However, the current will be non-zero between 50% and 85% of VDD at events tr2 and tr3 respectively during ramp up event only. In the interval between events tf1 and tf2 there is not current flowing through Ms5 because the OUTb signal is tied to GND and at event tf2 the signals at nodes OUTb and INb are tied to VDD thus turning on transistor Ms5 and turning off transistor Ma in the same time.

The waveform of FIG. 2g represents the current behaviour IMs6 during ramp up and ramp down events. The current behaviour IMs6 is the current through switch transistor Ms6 that is non-zero between events tr2 and tr3 where Ms6, M1 (202) and M4 (204) are turned on and transistor M1 converts the IN voltage into current i2. The current IMs6 is directly proportional to IN voltage and when it reaches the value of current i1, that is the reference voltage converted into current i1, the SENSEOUT switch to GND and consequently turn on transistor M1 and the current IMs6 will go to zero at event tr3.

The waveform of FIG. 2h represents the output OUT voltage behaviour during ramp up and ramp down events. The output OUT signal voltage detects the voltage comparison when the input voltage signal IN reaches 85% of VDD at event tr3, that is input voltage signal IN is equal to REF voltage and current i1 is equal to current i2. The output OUT voltage signal will increase to VDD when input voltage signal IN is higher than the REF voltage. In addition, the output OUT signal turns off the DC current consumption between events tr3 and tf2 that is between 85% of VDD and 50% of VDD, where is pulled down by buffer 203, that is the buffer 203 pulls down node IN2 when input voltage signal IN is less than inverter I3 trip point of 50% of VDD.

The node INb, connected on to the gate terminal of transistor Ma, controls the switching of transistor Ma during the comparison sequence. When the input voltage signal IN is 0V the NMOS transistor Ma is switched off because the gate source voltage (VGS) is equal to VDD such that no current will flow through Ma. The BIAS voltage is immediately pulled down when the input voltage IN is greater than the threshold voltage Vth of transistor Ms2. As a result, the intention current i1 (reference current) is higher than current i2 thus avoiding glitches in operation.

Figure 3A:
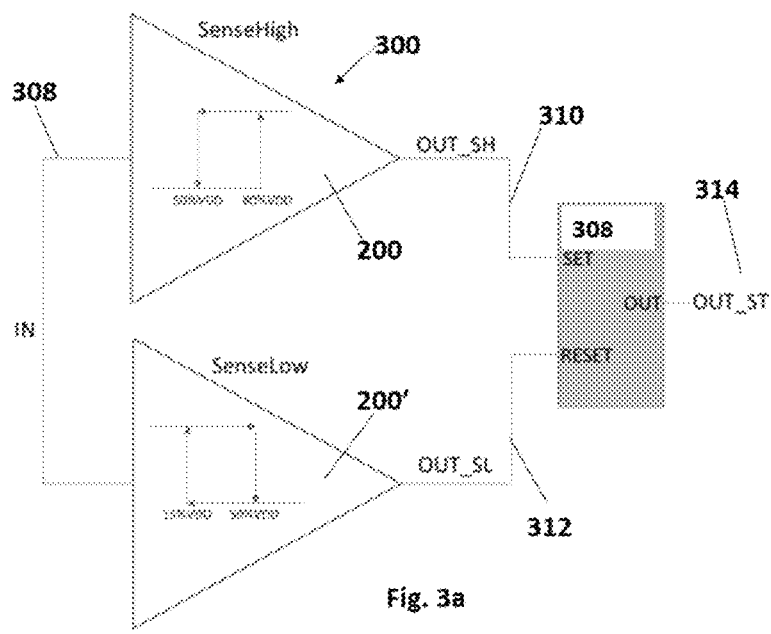
FIG. 3a illustrates a block diagram for a voltage comparator circuit comprising Schmitt trigger circuits of FIG. 1b and FIG. 1d according to an embodiment.

FIG. 3a illustrates a generalised functional block diagram of a voltage comparator circuit 300 utilising a high to low Schmitt trigger circuit 200 and a low to high triggered circuit 200' of the type described above with the output of each circuit 310, 312 connected to a latch 306. The latch 306 may be a SR (Set-Reset latch). The Schmitt trigger circuits 200, 200' are connected to a common input 308 to receive a common signal input IN. An output 310 of the first Schmitt trigger circuits 200 is connected to a first input SET of the latch 306, and an output 312 of the second Schmitt trigger circuits 200' is connected to a second input RESET of the latch 306. The output 314 of the voltage comparator circuit 300 is provided at the output OUT_ST 314 of the latch 306.

The first Schmitt trigger circuit 200 of the type described above according to embodiments is configured and arranged such that VT− is set and fixed at 50% of VDD and VT+ is adjustable from 51% to 90% of VDD. The second Schmitt trigger circuit 200' is configured and arranged such that VT− is set at 50% of VDD and VT+ is set at 10% of VDD. The skilled person will understand however that it is possible to reach 94% of VDD for VT+ and 7% of VDD for VT−. In applications, VDD can vary between 1.2 to 5.5 volts for example.

Figure 3B:
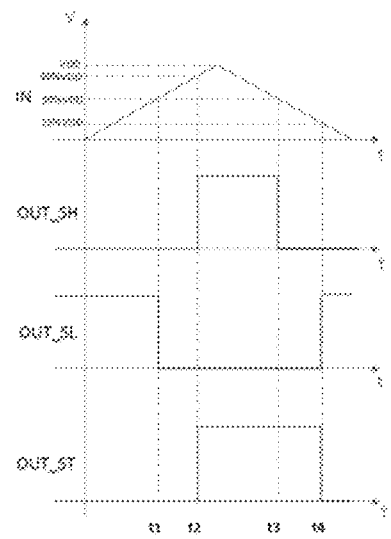

FIG. 3b illustrates operational waveforms, showing voltage versus time t, at the various nodes of the voltage comparator circuit 300 of FIG. 3a. The first waveform IN is the input signal voltage expressed as a percentage of VDD at the respective inputs 308 of the first and second Schmitt trigger circuits 200, 200'. The input voltage waveform IN is shown as a triangle wave for simplicity of explanation only, however, the skilled person will appreciate that any sinusoidal or non-sinusoidal input voltage waveform may be used. The second waveform OUT_SH is the output of the first Schmitt trigger circuit 200 and the third waveform OUT_SL is the output of the second Schmitt trigger circuit 200'. The fourth waveform OUT_ST is the output of the latch 306. The output OUT_SL 310 of the first Schmitt trigger circuit 200 is normally high and the output OUT_SH of the second Schmitt trigger circuit 200' is normally low.

Referring again to the input voltage waveform IN and specifically the rising edge of waveform IN, as the voltage level rises over time, to time t1 which corresponds to 50% of VDD, the output of the second Schmitt trigger circuit 200' is triggered to fall from a high level to a low level. The rising edge (OUT_SL) is responsible for resetting the SET RESET Latch 308 which occurs when the input voltage waveform IN voltage crosses the second Schmitt trigger circuit 200' VT– trip point from high negative VDD to GND (or low). The output of the OUT_ST is the composition of first and second Schmitt trigger circuits 200, 200'. As the voltage level of the input voltage waveform IN continues to rise at time t2 to 80% of VDD the output of the first Schmitt trigger circuit 200 is triggered to rise from a low level to a high level and the output voltage waveform rises from low to high by the operation of the latch 306. The input voltage waveform IN may continue to rise to a level approaching or equal to VDD or may begin to fall. As illustrated in FIG. 3b, the input voltage waveform IN falls over time, to time t3, which corresponds to a voltage level of 50% of VDD, at which point the output OUT_SH of the first voltage sensor 302 fall from high to low. As the input voltage waveform IN continues to fall at time t4 to 15% of VDD the output from the second voltage sensor 304 rises from a low level to a high level and the output OUT_ST of the latch 306 falls from a high level to a low level.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination. The term "comprising" does not exclude other elements or steps, the term "a" or "an" does not exclude a plurality. Reference signs in the claims shall not be construed as limiting the scope of the claims.

What is claimed is:

1. A Schmitt trigger voltage comparator circuit, comprising:
    a voltage reference input;
    a current source having a first voltage controlled current source connected to the voltage reference input and a second voltage controlled current source connected to a signal input for converting the signal input to an input current and the voltage reference input to a reference current;
    a current mirror having an input connected to an output of the first voltage controlled current source and configured and arranged to invert a direction of the reference current and an output of the current mirror connected to an output of the second voltage controlled current source; and
    a sequence controller for generating digital signals to control a first plurality of switches and a second plurality of switches, wherein the first plurality of switches control the first and second voltage controlled current sources and the second plurality of switches control the current mirror, and wherein the sequence controller comprises:
        a first buffer configured and arranged to control the current mirror and the first voltage controlled current source; and
        a second buffer configured and arranged to control the current mirror and the second voltage controlled current source.

2. The Schmitt trigger voltage comparator circuit of claim 1, wherein the first buffer is connected to a first current mirror enable switch and a first voltage controlled current source enable switch, and wherein the second buffer is connected to a second current mirror enable switch and a second voltage controlled current source enable switch.

3. The Schmitt trigger voltage comparator circuit of claim 2, wherein the first buffer comprises two inverters and the second buffer comprises two inverters.

4. The Schmitt trigger voltage comparator circuit of claim 1, wherein the first buffer comprises two inverters and the second buffer comprises two inverters.

5. The Schmitt trigger voltage comparator circuit of claim 1, further comprising a reference voltage circuit connected to the voltage reference input.

6. The Schmitt trigger voltage comparator circuit of claim 5, wherein the reference voltage circuit is a resistive voltage divider, comprising first and second control switches, and wherein the first control switch controls a reference voltage based on the signal input and the second control switch controls a reference voltage based on a signal from the sequence controller.

7. The Schmitt trigger voltage comparator circuit of claim 1, configured and arranged so that when the signal input is at a zero level or a maximum level there is zero DC current consumption at maximum or minimum supply voltage.

8. A logic circuit comprising: a first Schmitt trigger voltage comparator circuit according to claim 1, and a second Schmitt trigger voltage comparator circuit according to claim 1, wherein the first Schmitt trigger voltage comparator is a high to low voltage comparator and the second Schmitt trigger voltage comparator is a low to high voltage comparator.

9. The logic circuit of claim 8, further comprising a reference voltage having a level that is in a range of 5-95% of a supply voltage.

10. The logic circuit of claim 9, further comprising a reference voltage for the high to low voltage comparator having a level that is in a range of 50-95% of a supply voltage.

11. The logic circuit of claim 9, further comprising a reference voltage for the low to high voltage comparator having a level that is in a range of 5-50% of a supply voltage.

12. The logic circuit of claim 9, wherein the first Schmitt trigger voltage comparator circuit is configured and arranged to detect a low voltage to a high voltage transition and the second Schmitt trigger voltage comparator circuit is configured and arranged to detect a high voltage to low voltage transition.

13. The logic circuit of claim 8, further comprising a reference voltage for the high to low voltage comparator having a level that is in a range of 50-95% of a supply voltage.

14. The logic circuit of claim 13, wherein the first Schmitt trigger voltage comparator circuit is configured and arranged to detect a low voltage to a high voltage transition and the second Schmitt trigger voltage comparator circuit is configured and arranged to detect a high voltage to low voltage transition.

15. The logic circuit of claim 8, further comprising a reference voltage for the low to high voltage comparator having a level that is in a range of 5-50% of a supply voltage.

16. The logic circuit of claim 15, wherein the first Schmitt trigger voltage comparator circuit is configured and arranged to detect a low voltage to a high voltage transition and the second Schmitt trigger voltage comparator circuit is configured and arranged to detect a high voltage to low voltage transition.

17. The logic circuit of claim 8, wherein the first Schmitt trigger voltage comparator circuit is configured and arranged to detect a low voltage to a high voltage transition and the second Schmitt trigger voltage comparator circuit is configured and arranged to detect a high voltage to low voltage transition.

18. The logic circuit of claim 8, further comprising a latch for receiving an output of the first Schmitt trigger voltage comparator circuit and the second Schmitt trigger voltage comparator circuit, the latch comprising an output, wherein the output of the latch is enabled when the output of the first Schmitt trigger voltage comparator circuit is high and an output of the second Schmitt trigger voltage comparator circuit is low.

19. The logic circuit of claim 18, wherein the latch is a Set-Reset Latch.

20. A Schmitt trigger voltage comparator circuit, comprising:
a voltage reference input;
a current source having a first voltage controlled current source connected to the voltage reference input and a second voltage controlled current source connected to a signal input for converting the signal input to an input current and the voltage reference input to a reference current;
a current mirror having an input connected to an output of the first voltage controlled current source and configured and arranged to invert a direction of the reference current and an output of the current mirror connected to an output of the second voltage controlled current source; and
a sequence controller for generating digital signals to control a first plurality of switches and a second plurality of switches, wherein the first plurality of switches control the first and second voltage controlled current sources and the second plurality of switches control the current mirror;
a reference voltage circuit connected to the voltage reference input, the reference voltage circuit being a resistive voltage divider comprising first and second control switches, and wherein the first control switch controls a reference voltage based on the signal input and the second control switch controls a reference voltage based on a signal from the sequence controller.

* * * * *